United States Patent
Vullings et al.

(10) Patent No.: US 7,360,716 B2
(45) Date of Patent: Apr. 22, 2008

(54) METHOD OF DETERMINING AT LEAST ONE MARKING ELEMENT ON A SUBSTRATE

(75) Inventors: Henricus Johannes Louis Marie Vullings, Eindhoven (NL); Jacobus Johannes Govardus Maria Van Oosterhout, Eindhoven (NL); Joseph Louis Horijon, Eindhoven (NL)

(73) Assignee: Assembleon B.V., Eindhoven (NL)

( * ) Notice: Subject to any disclaimer, the term of this patent is extended or adjusted under 35 U.S.C. 154(b) by 217 days.

(21) Appl. No.: 10/550,342

(22) PCT Filed: Mar. 25, 2004

(86) PCT No.: PCT/IB2004/050331

§ 371 (c)(1),
(2), (4) Date: Sep. 23, 2005

(87) PCT Pub. No.: WO2004/086843

PCT Pub. Date: Oct. 7, 2004

(65) Prior Publication Data

US 2007/0034695 A1 Feb. 15, 2007

(30) Foreign Application Priority Data

Mar. 28, 2003 (EP) ................... 03100814

(51) Int. Cl.
*G06K 19/06* (2006.01)

(52) U.S. Cl. .................. 235/494; 235/454; 378/19; 324/158.1

(58) Field of Classification Search ............... 235/494, 235/454; 378/19; 324/158.1
See application file for complete search history.

(56) References Cited

U.S. PATENT DOCUMENTS 5,974,169 A * 10/1999 Bachelder .................. 382/151

FOREIGN PATENT DOCUMENTS

| WO | WO 03/005792 | * | 1/2003 |
| WO | WO 03/005793 | * | 1/2003 |
| WO | WO03005792 A1 | | 1/2003 |
| WO | WO03005793 A1 | | 1/2003 |

OTHER PUBLICATIONS

International Search Report of International Application No. PCT/IB2004/050331 Contained in International Publication No. WO2004086843.
Written Opinion of the International Searching Authority for International Application No. PCT/IB2004/050331.

* cited by examiner

*Primary Examiner*—Michael G. Lee
*Assistant Examiner*—Allyson N Trail
(74) *Attorney, Agent, or Firm*—Foley & Lardner LLP

(57) ABSTRACT

A method of establishing at least one marking element on a substrate (1). By means of design data of the substrate (1) at least a fictitious marking element (5) on the substrate (1) is determined. The fictitious marking element (5) should then be unique for a predefined area of the substrate (1). The fictitious marking element is obtained by selecting at least two transitions (6, 7, 17, 18) of at least one element on the substrate while the transitions (6, 7, 17, 18) enclose an angle to each other.

4 Claims, 7 Drawing Sheets

METHOD OF DETERMINING AT LEAST ONE MARKING ELEMENT ON A SUBSTRATE

FIELD OF THE INVENTION

The invention relates to a method of determining at least one marking element on a substrate.

BACKGROUND OF THE INVENTION

It is known per se to introduce marking elements on a substrate. These marking elements are used for determining reference positions on a substrate by means of a camera, after which components are placed on a desired position relative to the reference positions on the substrate by means of a placement machine.

A disadvantage of such a known method is inter alia that the marking elements specifically introduced on the substrate for this purpose take up space, which is undesired with substrates becoming ever smaller. In addition, the specific marking element may be located remote from the position at which a component is subsequently to be placed, as a result of which the measurement may be inaccurate and time-consuming.

SUMMARY OF THE INVENTION

It is an object of the present invention to provide a method according to which no specific marking elements need to be introduced on a substrate any longer.

This object is achieved with the device according to the invention in that at least one fictitious marking element on the substrate is determined from design data of the substrate, where the fictitious marking element is unique for a predefined area of the substrate.

By selecting a specific property in the design data of the substrate, a fictitious marking element can be obtained if the selected property is unique for a predefined area. The advantage is that this fictitious marking element is already present on the substrate, as a result of which no separate marking element needs to be introduced on the substrate. With the aid of the fictitious marking element the position on the substrate is established in a simple manner by means of a camera. If only a limited part of the substrate can be perceived with a camera, it is not necessary for a specific marking element to be introduced on this part, but a fictitious marking element from the design data to be determined for that part. Moreover, in this manner a fictitious marking element can be established on substantially any part of a substrate, which is practical at the time when only a limited part of the substrate is perceivable with a camera.

An embodiment of the method according to the invention is characterized in that the fictitious marking element is obtained by selecting at least two transitions of at least one element on the substrate where the transitions enclose an angle to each other.

Transitions, such as for example the edges of electrically conductive tracks on the substrate are suitable for being perceived by a camera. Selecting two transitions that enclose an angle to each other guarantees that based on the two transitions it is very well possible to establish the position of the element on the substrate. The transitions may either intersect or not. The angle is preferably 90°.

Another embodiment of the method according to the invention is characterized in that the two transitions are positioned substantially transverse to each other.

An advantage of such an embodiment is that it is relatively simple to determine the position on the substrate on the basis of two transitions that are positioned substantially transverse to each other. In addition, transitions on the substrate which are not positioned substantially transverse to each other can be neglected, so that in the design data a fictitious marking element can be selected more rapidly.

An embodiment of the method according to the invention is characterized in that the substrate spans an x, y system where an x coordinate of the first transition combined with a y coordinate of the second transition is selected from the two selected transitions.

By determining the coordinates of transitions, the position of the fictitious marking element can be determined relatively simply and accurately from an image produced by the camera.

A further embodiment of the method according to the invention is characterized in that the position of the two selected transitions is compared with the position of other sets of at least two transitions in order to determine whether the two selected transitions are unique for the predefined area of the substrate.

In this way it is verified by means of a processor whether a unique, reliable and recognizable marking element has been selected. Each selected set of transitions that is unique for the predefined area may serve as a fictitious marking element.

Another embodiment of the method according to the invention is characterized in that the element comprises at least two electrically conductive track portions in which each track portion is bounded by at least two transitions running substantially parallel, with a diameter running in between, after which the diameters of the track portions are selected, which diameters enclose an angle to each other.

Selecting the diameter of part of a track is advantageous in that variations of the width of the track are averaged.

Yet another embodiment of the method according to the invention is characterized in that the two selected diameters are compared with other sets of at least two diameters to determine whether the two selected diameters are unique for the predefined area of the substrate.

In this way there is determined whether the selected diameters can be used as a fictitious marking element.

A still further embodiment of the method according to the invention is characterized in that the fictitious marking element is obtained by the selection of at least two circles where the mutual position of the circles is determined relative to each other.

An advantage of such an embodiment is that various properties of circles may be used as a fictitious marking element. For example, diameters of circles, combined if desired with positions of the centers of circles, may serve as marking elements.

Yet a further embodiment of the method according to the invention is characterized in that the position of centers of the two circles is selected.

By selecting the centers of the circles a marking element will be determined is relatively simple to establish.

Yet another embodiment of the method according to the invention is characterized in that the position of the two selected circles is compared with positions of other sets of at least two circles to find out whether the two selected circles are unique for the predefined area of the substrate.

In this way it is established whether the selected combination of circles is unique for the predefined area of the substrate and may therefore serve as a suitable fictitious marking element.

A still further embodiment of the method according to the invention is characterized in that for determining the marking element from the design data the position of components in a component layer is used, the position of tracks in an electrically conductive layer, the position of anti-soldering agent in an anti-soldering layer and/or of text in a text layer.

In principle, all available data of the substrate can be used for determining a fictitious marking element. The only condition is that the property is unique in a predefined area and can be established in advance, that is to say, prior to the placing of components on the substrate.

Yet a further embodiment of the method according to the invention is characterized in that the fictitious marking element is used for placing a component on a substrate.

Such an embodiment is advantageous in that the fictitious marking element property already present on the substrate is used for correctly positioning components on the substrate.

BRIEF DESCRIPTION OF THE DRAWINGS

The invention will now be clarified with reference to the drawing in which.

Like parts in the Figures carry like reference numerals.

DETAILED DESCRIPTION

FIGS. 1a-1d show graphs, which are based on processor-stored design data of a substrate and components to be introduced thereon. The components are connected by means of a soldering agent with electrically conductive tracks present on the substrate. Text has been provided on the substrate for informative purposes. Such a substrate with components thus provided is known per se.

Figure 1A:
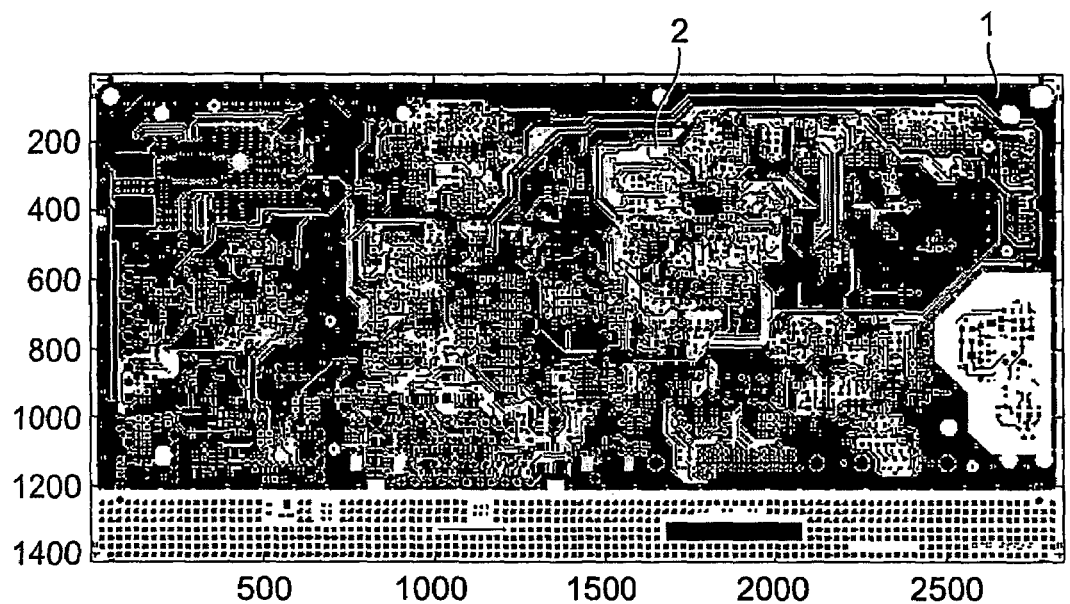
FIGS. 1a-d show graphs in which are depicted the position of a track pattern, the position of components, the position of anti-soldering agent and the position of text on a substrate to be produced, respectively.

FIG. 1a shows a graph of a substrate 1 in which the position of tracks 2 present on the substrate 1 is shown. The substrate design data stored in the processor comprises the exact position of each track in an x, y plane.

Figure 1B:
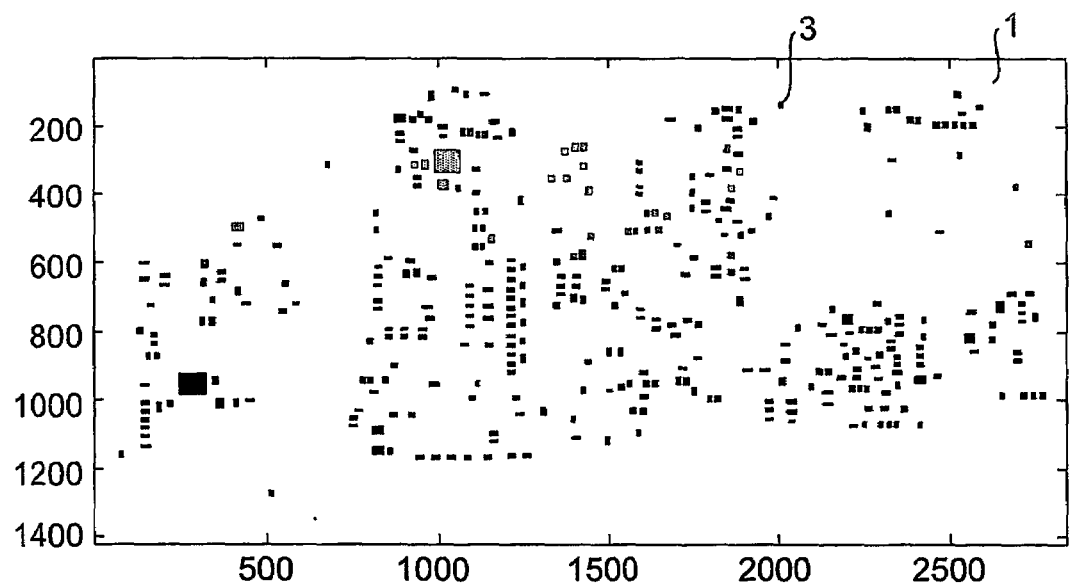

FIG. 1b shows a graph in which the position of components 3 to be placed on a substrate is represented.

Figure 1C:
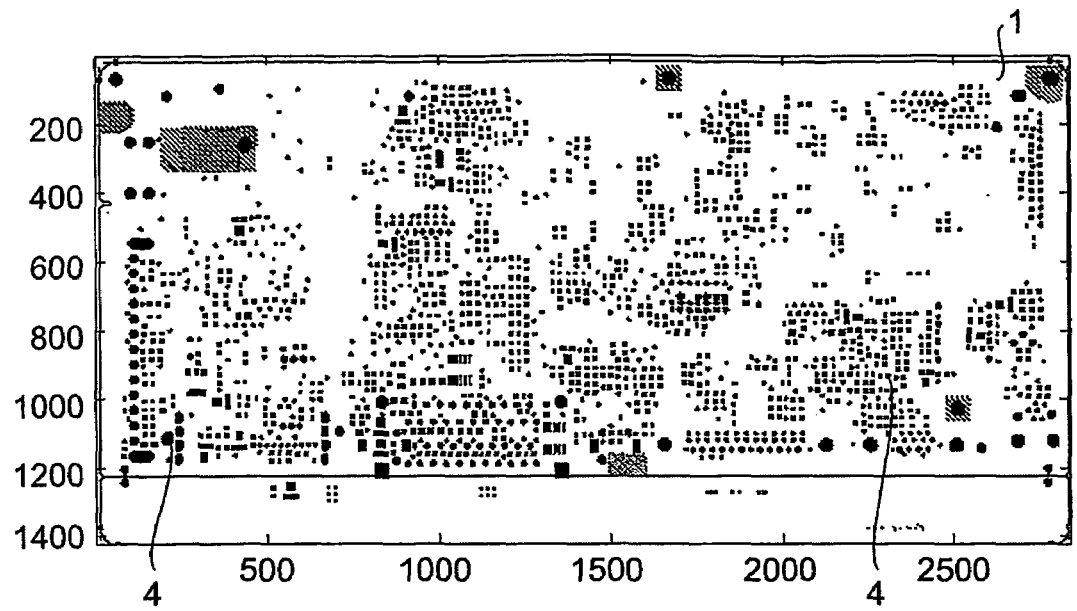

FIG. 1c shows a graph in which the positions are shown of anti-soldering agent 4 present on a substrate 1. No soldering agent will stick to these positions when components 3 are affixed to the substrate 1 by means of soldering. Black dots visible in FIG. 1c are areas where there is no anti-soldering agent.

Figure 1D:
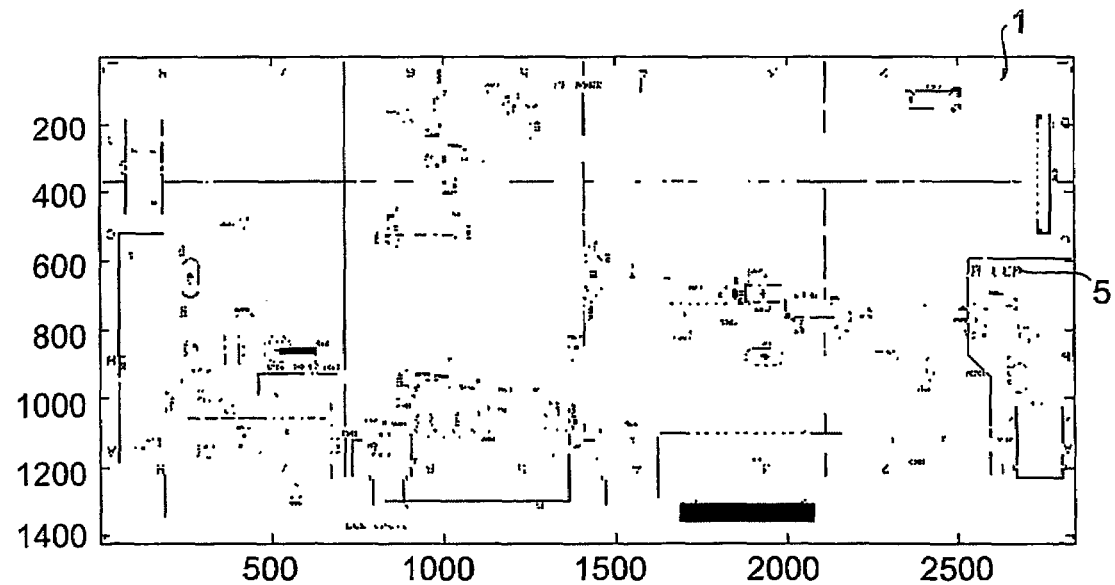

FIG. 1d shows a graph from which the positions of text present on a substrate 1 can be deduced.

Figure 2:
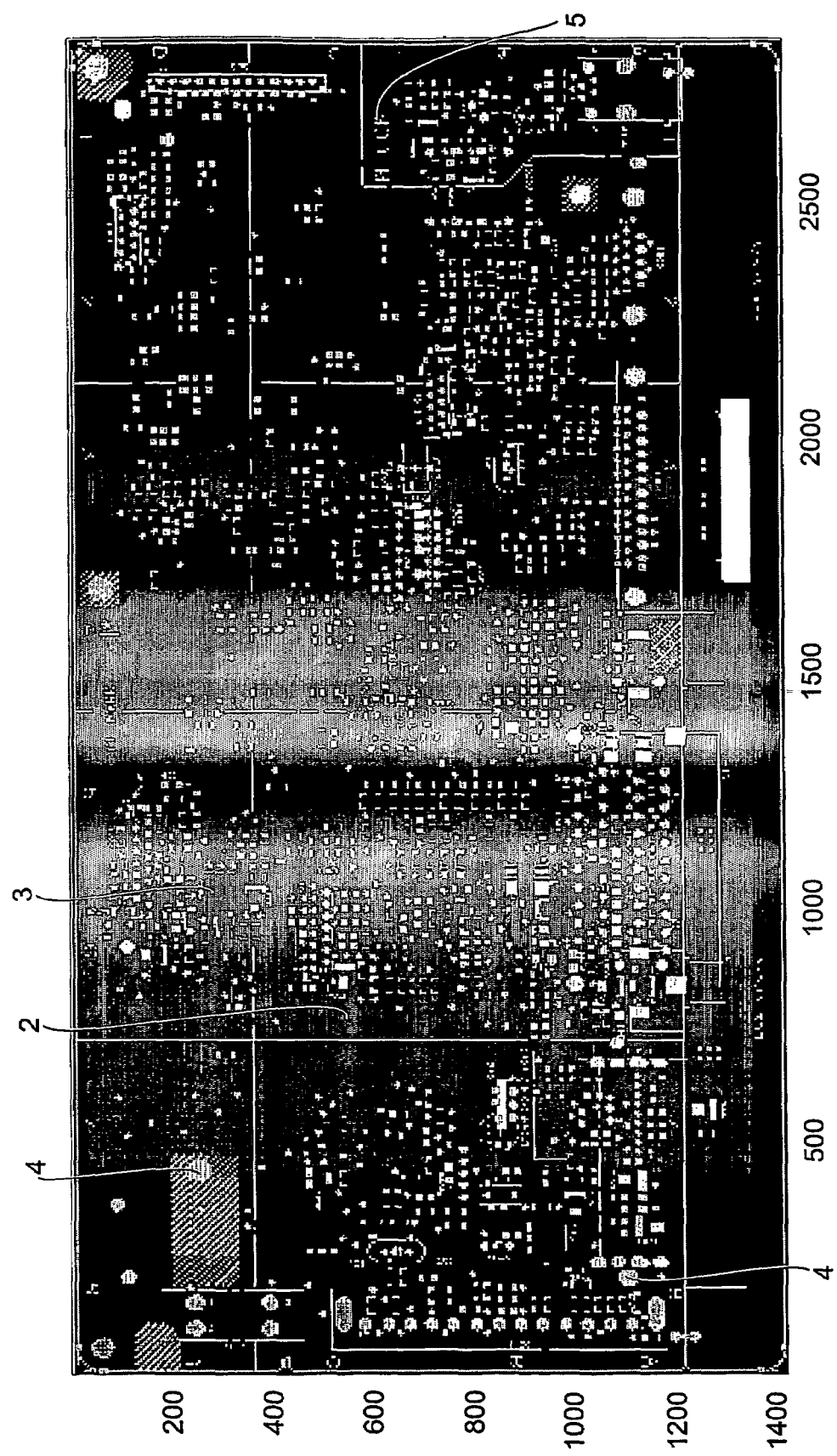
FIG. 2 shows a graph assembled from FIGS. 1a-1d of a substrate to be produced with components placed thereon.

FIG. 2 shows a graph assembled from the graphs shown in FIGS. 1a-1d so that an overall view is obtained of a substrate 1 as is stored in the design data.

The information described thus far is stored in the design data of a substrate and easily accessible by means of a processor.

By means of the method according to the invention transitions are selected from these design data, which transitions are easily perceivable on a physical substrate by means of a camera. Moreover, these transitions should have a relatively accurate position relative to the substrate.

Since text is introduced on a substrate in a relatively inaccurate manner, the positions of the text as known from FIG. 1d as well as an area around each text, in which area the text could also be positioned as a result of inaccurate positioning of the text on the substrate 1, are featured as unreliable parts of the substrate 1 for determining desired transitions.

Also the absence of anti-soldering agent on a substrate in this embodiment of the method according to the invention is defined as an undesired area. The fact is that connecting elements of a component may be located in these areas. In order to allow the marking element to be determined to be independent of the fact whether on the substrate to be examined by means of a camera a component 3 there has already been placed or not, also the areas where components 3 may reside are defined as unsuitable areas. After the design data have been processed in this manner, only parts of the track pattern 2 shown in FIG. 1a are left. This track pattern 2 in the substrates to be examined is located underneath the anti-soldering layer but is visible all right through the anti-soldering layer.

Figure 3:
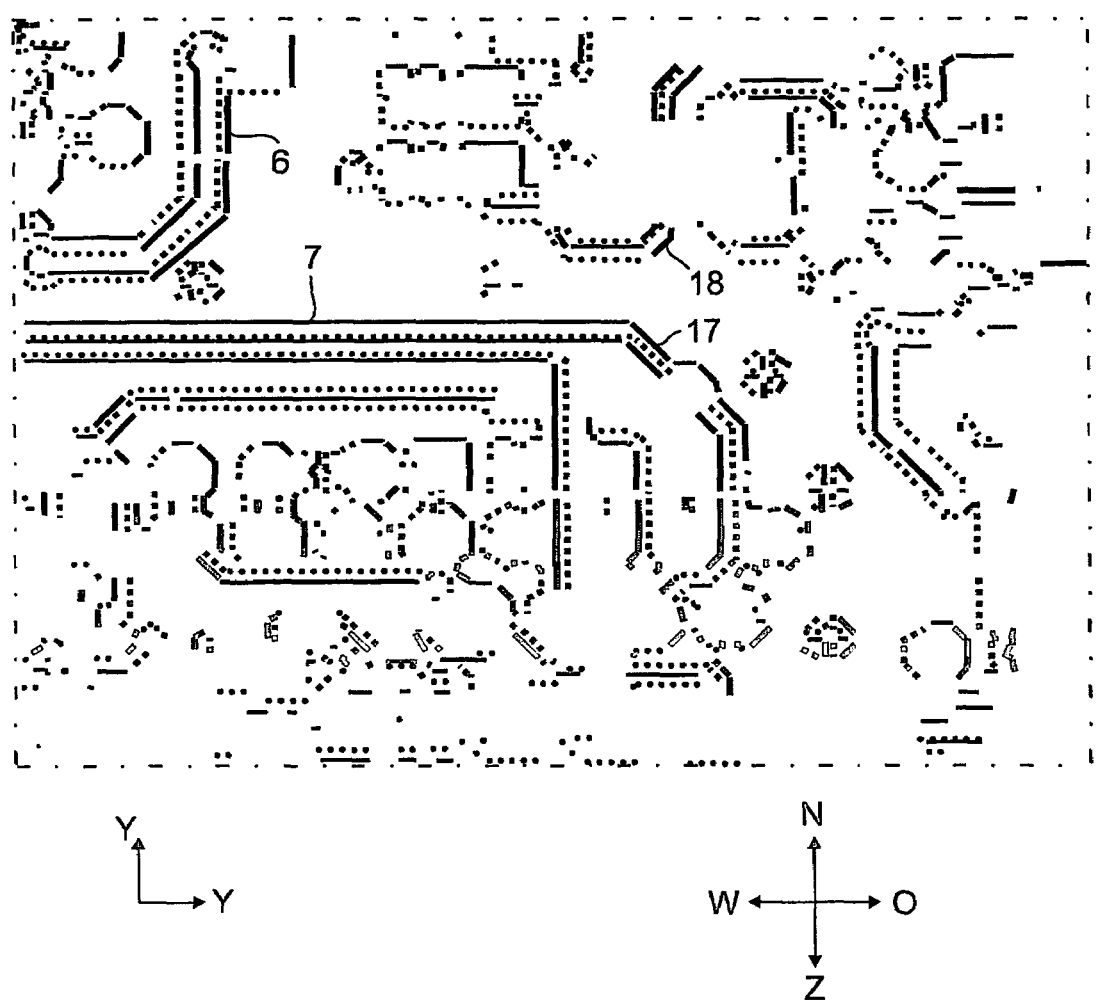
FIG. 3 shows a graph of part of the graph shown in FIG. 2 illustrating transitions between elements.
Figure 4:
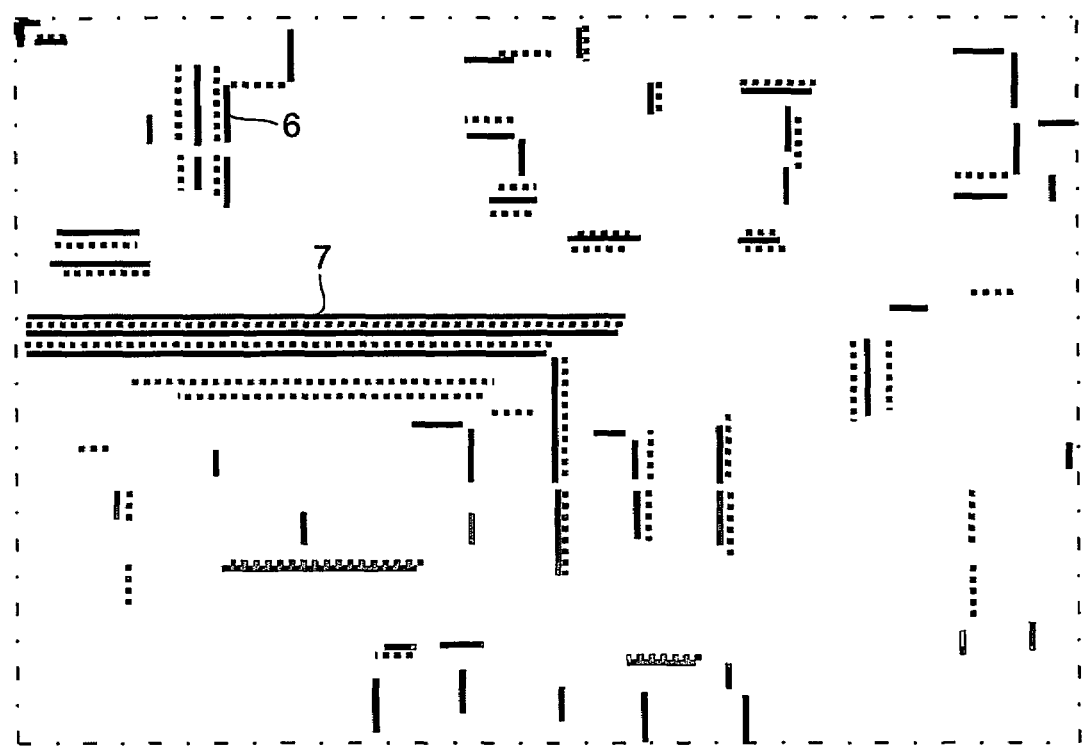
FIG. 4 shows a graph in which a selection of the graph shown in FIG. 3 is depicted.
Figure 4:
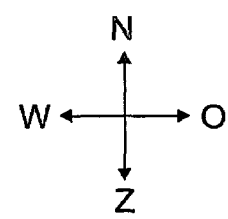
Figure 5:
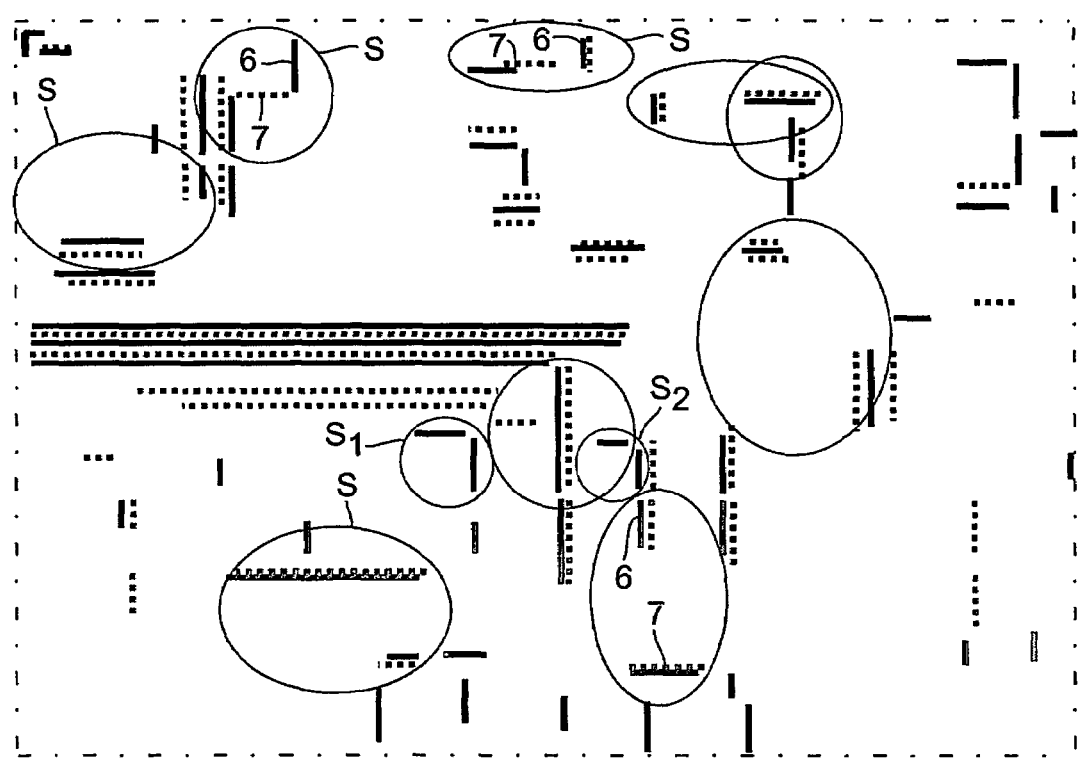
FIG. 5 shows the graph shown FIG. 4 in which pairs of transitions are illustrated.

FIG. 3 shows a graph of part of the substrate 1 shown in FIG. 3 in which vertical and horizontal boundaries 6, 7 of a track 2 are shown. In the graph shown in FIG. 3 the boundary 6 forms a vertically extending transition of a track 2 while the boundary 7 forms a horizontal upper boundary of another track 2. Solid lines in FIGS. 3 and 5 show the northern and eastern transitions N and O of a track 2 to the substrate, the dotted lines representing the southern and western transitions Z and W. The information about the transitions 6 and 7 shown in the graph in FIG. 3 is then processed by the processor in such a way that only horizontally and vertically extending transitions remain. This selection of transitions is shown in FIG. 4.

Then sets S of transitions are defined by the processor where a set S each time comprises a horizontally extending transition and a vertically extending transition. FIG. 5 represents only a few sets S of transitions for clarity. However, the processor may also be instrumental in defining as sets all combinations of horizontal and vertical transitions present in a certain area. From each set S of transitions the relative mutual positions of the transitions relative to each other as well as for example the length L of the transitions 6, 7 can be determined from the design data. From a transition may then also be indicated whether it is a northern transition N, eastern transition O, southern transition Z or western transition W. This can indeed be well perceived with a camera The length of a transition need not be determined. It is sufficient per se if a single transition N or Z and a single transition O or W is determined within an area, the combinations of which transitions within the area are unique. Subsequently, it is determined from each set of transitions 6, 7 whether they occur only one time or a number of times within a selected area For example in FIG. 5 is represented a set S1 of a transition extending vertically or horizontally of an electrically conductive track, which transition corresponds to a set S2. If the set S1 were used as a fictitious marking element, there would be a risk that with the aid of a camera the set S2 in lieu of set S1 would be established as the fictitious marking element. This would mean that at a later stage in which components are placed on the substrate relative to the position of the fictitious marking element, this component would be placed on the substrate not at a correct position relative to the desired marking element, but relative to the set of transitions S2 erroneously defined as the marking element on the substrate, so that these components would not be positioned on the substrate on the right position. As a result, the processor will consider both the set of transitions S1 and the set of transitions S2 unusable.

Figure 6:
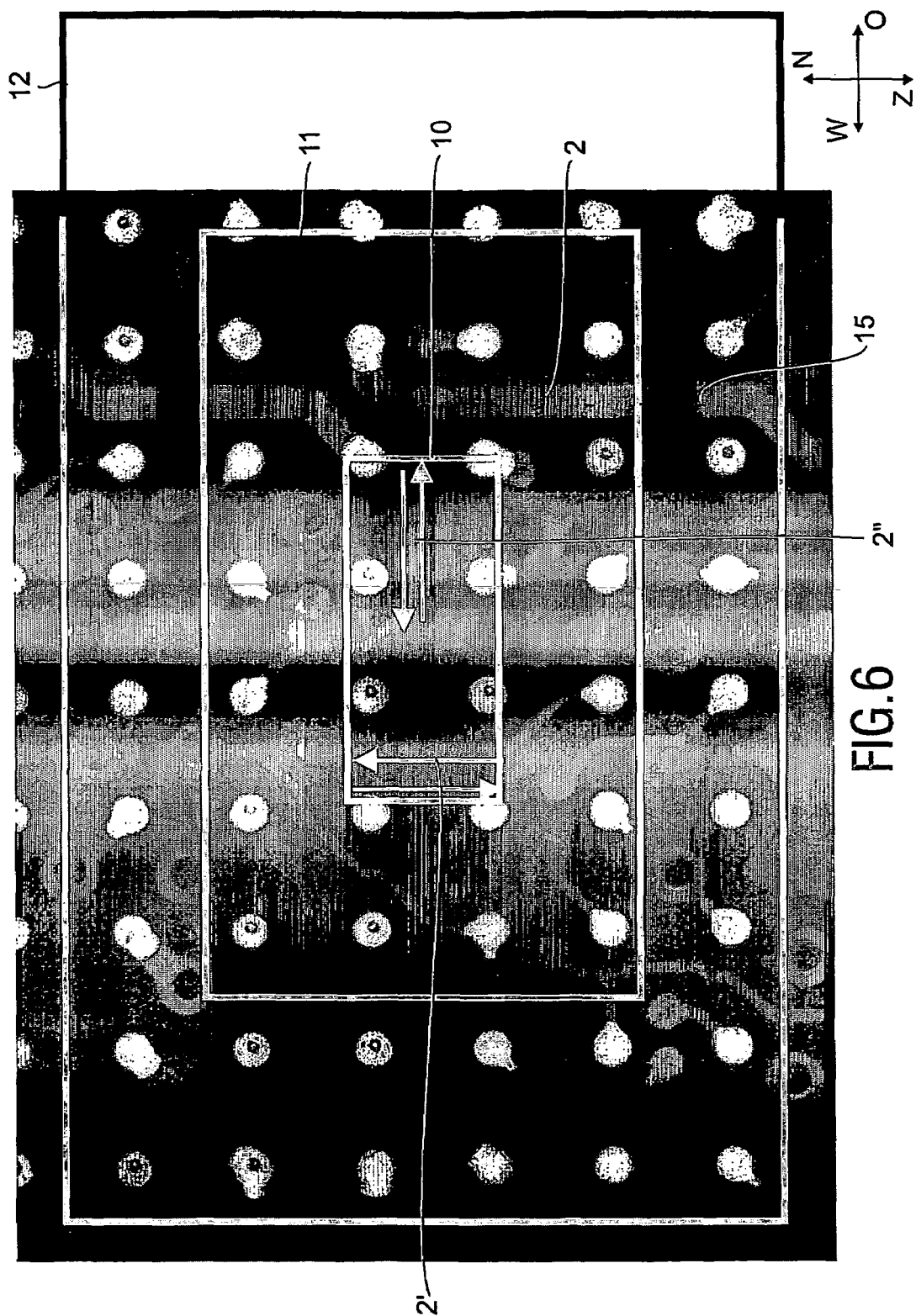
FIG. 6 shows part of the graph shown in FIG. 2 in which various areas are depicted.

FIG. 6 shows a plan view of a substrate in which three areas are defined. The central, smallest area 10 is the area that can be perceived at a certain moment by means of a camera. The size of the area 10 particularly depends on the camera used. The surrounding area 11 is the area that the camera scans in steps or in continuous fashion while searching for and determining the position of the fictitious marking elements established from the design data by means of the method. The area 12 surrounding the area 11 is the area within which the marking element determined from the design data is unique. The size of the area 11 depends inter alia on the accuracy with which a substrate 1 is positioned underneath the camera. The area 11 should be so large that, after the substrate 1 has been positioned underneath the camera, the fictitious marking element with substantially absolute certainty will be present within the area 11. If the area 11 is selected of too large a size, the camera is to scan a relatively large area, which is time-consuming. If, however, the area is selected of too small a size there is a risk of the marking element not being present within the area 11 in the event of an inaccurately positioned substrate. In the embodiment represented here the surface of the area 11 is about nine times as large as the size of the area 10. The area 12 surrounding the area 11 is to have such a size that if the substrate 1 is somewhat shifted relative to the position shown of the area 11, there are no sets of transitions corresponding to the fictitious marking element 6, 7 within the surrounding area 12. If this area 12 is selected to be relatively large, the uniqueness of the fictitious marking element should be established over a relatively large area when the design data are processed, which may be time-consuming. If, however, the area 12 is selected to be too small, there is a risk of a similar set of transitions being present if the substrate 1 is slightly shifted relative to the camera, so that there is a risk of confusion. In the example shown in FIG. 6 the surface of the area 12 is about 2.5 times as large as the surface of the area 11.

Another possibility is the selection of a circular element as a marking element for substrates that have a number of circular elements. In the same way as described with reference to FIGS. 2-5 it is possible to select only the circular elements from the design data of the substrate 13, after which, subsequently, all possible combinations of sets of for example two circular elements are analyzed and examined whether they occur once or a number of times within a selected area of the substrate 13. Only if a certain set of circular elements occur once within the selected area can this set of circular elements serve as a fictitious marking element within the selected area.

From the design data for example the diameter of a circular element can be derived. If no other circular elements that have a similar diameter are present within the selected area, this circular element may serve as a fictitious marking element. In a case like this, however, there is still the possibility that with the aid of the camera the position of this circular element can be determined, it is true, but that the substrate that accommodates the circular element is rotated relative to this circular element. Therefore, in these cases where the substrate may be slightly rotated, it is useful making use of at least two circular elements of which the mutual relative positions are established in addition to for example the diameter. This combination of possibilities may then be used as a fictitious marking element.

It is alternatively possible to utilize sets of transitions 17, 18 positioned in FIG. 3 at an angle in lieu of sets of horizontal and vertical transitions. The transitions should preferably enclose an angle to each other so that based on the camera-detected position of the fictitious marking element, not only the position but also the orientation of the substrate 1 relative to this position is known. If also the ends of a transition 7 are known from the design data, it is alternatively possible to use a single transition 7 as a fictitious marking element.

In order to further increase the accuracy in determining the position of a fictitious marking element, in lieu of determining the position of an edge or transition of an electrically conductive track 2, the position i.e. transition on either one of the two sides of the track is determined. Then the position of the diameter 15 of a track is determined from this (see for example FIG. 6). The advantage of this is that the track width may slightly vary as a result of the manufacturing method. However, the position of the diameter remains unchanged. Therefore, the diameter 15 forms a more accurate position of a track than a transition between the track 2 and the substrate 1. In the embodiment shown in FIG. 6 this means that from the track 2' both the position of the western transition W and eastern transition O is to be determined whereas from track 2" both the position of the northern transition N and southern transition Z is to be determined, subsequent to which the positions of the diameters can be calculated.

The use of fictitious marking elements is advantageous in that no elements need be placed on the substrate that are used only as marking elements.

If only a limited part of a substrate is visible underneath a camera, it is always possible to define a fictitious marking element within this limited part, so that the position of the substrate relative to the camera can be checked in a simple manner. This is especially important if a number of component placement machines located side by side are used for simultaneously placing components on a single substrate while only a substrate part located near the component placement machine can be perceived by means of the camera belonging tgo each component placement machine.

It is possible to utilize any arbitrary component present on a substrate as a fictitious marking element. For example, also text present on the substrate can be utilized, provided its position has been accurately defined relative to the position of the components to be placed.

It is possible to determine for each track a number of for example six points distant from each other for determining the position of the relevant track.

It may be obvious that if a marking element has more transitions, the accuracy with which the position of the marking element can be determined, is increased.

The invention claimed is:

1. A method of determining at least one marking element on a substrate (1), characterized in that at least one fictitious marking element (5) on the substrate (1) is determined from design data of the substrate (1), where the fictitious marking element (5) is unique for a predefined area of the substrate (1), and in that the fictitious marking element (5) is obtained from the selection of at least two circles where the position of the circles relative to each other is determined.

2. A method as claimed in claim 1, characterized in that the position of the centers of the two circles is selected.

3. A method as claimed in claim 1, characterized in that the position of two selected circles is compared with positions of other sets of at least two circles to find out whether the two selected circles are unique for the predefined area of the substrate.

4. A method of determining at least one marking element on a substrate (1), characterized in that at least one fictitious marking element (5) on the substrate (1) is determined from design data of the substrate (1), where the fictitious marking element (5) is unique for a predefined area of the substrate (1), and in that for determining the marking element from the design data at least one of the position of components in a component layer, the position of tracks in an electrically conductive layer, the position of anti-soldering agent in an anti-soldering layer, and the position of text in a text layer is used.

* * * * *